(12) United States Patent
Feng et al.

(10) Patent No.: US 9,910,118 B2
(45) Date of Patent: Mar. 6, 2018

(54) SYSTEMS AND METHODS FOR CARTESIAN DYNAMIC IMAGING

(71) Applicant: University of Virginia Patent Foundation, Charlottesville, VA (US)

(72) Inventors: Xue Feng, Charlottesville, VA (US); Michael Salerno, Charlottesville, VA (US); Christopher M. Kramer, Charlottesville, VA (US); Craig H. Meyer, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 1354 days.

(21) Appl. No.: 13/867,922

(22) Filed: Apr. 22, 2013

(65) Prior Publication Data

US 2013/0307536 A1 Nov. 21, 2013

Related U.S. Application Data

(60) Provisional application No. 61/636,501, filed on Apr. 20, 2012.

(51) Int. Cl.
*G01V 3/00* (2006.01)
*G01R 33/48* (2006.01)
*G01R 33/56* (2006.01)
*G01R 33/563* (2006.01)
*G01R 33/561* (2006.01)

(52) U.S. Cl.
CPC ....... *G01R 33/482* (2013.01); *G01R 33/5608* (2013.01); *G01R 33/56308* (2013.01); *G01R 33/5611* (2013.01)

(58) Field of Classification Search
CPC .............. G01R 33/482; G01R 33/5608; G01R 33/56308; G01R 33/5611
USPC ....................................................... 324/309
See application file for complete search history.

(56) References Cited

U.S. PATENT DOCUMENTS

| | | |
|---|---|---|
| 4,999,580 A | 3/1991 | Meyer et al. |
| 5,233,301 A | 8/1993 | Meyer et al. |
| 5,402,067 A | 3/1995 | Pauly et al. |
| 5,427,101 A | 6/1995 | Sachs et al. |
| 5,485,086 A | 1/1996 | Meyer et al. |
| 5,539,313 A | 7/1996 | Meyer |
| 5,617,028 A | 4/1997 | Meyer et al. |
| 5,650,723 A | 7/1997 | Meyer |

(Continued)

OTHER PUBLICATIONS

Sumbul et al., Improved Time Series Reconstruction for Dynamic Magnetic Resonance Imaging, 2009, IEEE Trans Med Imaging.*

(Continued)

*Primary Examiner* — Susan Lee
(74) *Attorney, Agent, or Firm* — Meunier Carlin & Curfman LLC

(57) ABSTRACT

Systems and methods for Cartesian dynamic imaging are disclosed. In one aspect, in accordance with one example embodiment, a method includes acquiring magnetic resonance data for an area of interest of a subject that is associated with one or more physiological activities of the subject and performing image reconstruction comprising Kalman filtering or smoothing on Cartesian images associated with the acquired magnetic resonance data. Performing the image reconstruction includes increasing at least one of spatial and temporal resolution of the Cartesian images.

18 Claims, 8 Drawing Sheets

(56) References Cited

U.S. PATENT DOCUMENTS

| | | | |
|---|---|---|---|
| 5,957,843 | A | 9/1999 | Luk Pak et al. |
| 6,020,739 | A | 2/2000 | Meyer et al. |
| 6,633,673 | B1* | 10/2003 | Shen ................. H04N 19/70 382/232 |
| 7,558,612 | B2 | 7/2009 | Meyer |
| 7,583,082 | B1 | 9/2009 | Hu et al. |
| 7,642,777 | B1 | 1/2010 | Meyer et al. |
| 7,888,935 | B1 | 2/2011 | Tan et al. |
| 8,089,278 | B1* | 1/2012 | Du ................. G01R 33/4824 324/307 |
| 2003/0193337 | A1 | 10/2003 | Meyer |
| 2008/0021304 | A1* | 1/2008 | Stemmer ............ G01R 33/4824 600/410 |

OTHER PUBLICATIONS

Kashyap et al., A Fast & Accurate Non-Iterative Algorithm for Regularized Non-Cartesian MRI, 2010, IEEE, pp. 265-268.*

Ying et al., An Efficient Non-Iterative Reconstruction Algorithm for Parallel MRI with Arbitrary K-Space Trajectories, 2005, 2005 IEEE Engineering in Medicine and Biology 27th Annual Conference, pp. 1344-1347.*

Matthias Seeger, Speeding up Magnetic Resonance Image Acquisition by Bayesian Multi-Slice Adaptive Compressed Sensing, 2009, Advances in Neural Information Processing Systems 22.*

Adluru, G. et al., "Temporally Constrained Reconstruction of Dynamic Cardiac Perfusion MRI," Magn Reson Med., 2007, pp. 1027-1036, 57(6), Wiley-Liss, Inc.

Brummer, M. et al., "Noquist: Reduced Filed-of-View Imaging by Direct Fourier Inversion," Magn Reson Med., 2004, pp. 331-342, 51(2), Wiley-Liss, Inc.

Buehrer, M. et al., "Array Compression for MRI with Large Coil Arrays," Proc. Intl. Soc. Mag. Reson Med., 2007, p. 744, 15.

Gelb, A. et al., "Applied Optimal Estimation," The Analytic Sciences Corporation, 2001, 16th printing, The MIT Press.

Griswold, M. et al., "Generalized Autocalibrating Partially Parallel Acquisitions (GRAPPA)," Magn Reson Med., 2002, pp. 1202-1210, 47(6), Wiley-Liss, Inc.

Hamilton, L.H., ""PINOT": Time-Resolved Parallel Magnetic Resonance Imaging with a Reduced Dynamic Field of View," Magn Reson Med., 2011, pp. 1062-1074, 65(4), Wiley-Liss, Inc.

Jung, H. et al., "k-t FOCUSS: A General Compressed Sensing Framework for High Resolution Dynamic MRI," Magn Reson Med., 2009, pp. 103-116, 61(3), Wiley-Liss, Inc.

Kellman, P. et al., "Adaptive Sensitivity Encoding Incorporating Temporal Filtering (TSENSE)," Magn Reson Med., 2001, pp. 846-852, 45(5), Wiley-Liss, Inc.

Kyriakos, W. et al., "Sensitivity Profiles from an Array of Coils for Encoding and Reconstruction in Parallel (SPACE RIP)," Magn Reson Med., 2000, pp. 301-308, 44(2), Wiley-Liss, Inc.

Madore, B. et al., "Unaliasing by Fourier-Encoding the Overlaps Using the Temporal Dimension (UNFOLD), Applied to Cardiac Imaging and fMRI," Magn Reson Med., 1999, pp. 813-828, 42(5), Wiley-Liss, Inc.

Pruessmann, K. et al., "SENSE: Sensitivity Encolding for Fast MRI," Magn Reson Med., 1999, pp. 952-962, 42(5), Wiley-Liss, Inc.

Rehwald, W. et al., "Theory of High-Speed MR Imaging of the Human Heart with the Selective Line Acquisition Mode," Radiology, 2001, pp. 540-547, 220(2), RSNA.

Sodickson, D. et al., "Simultaneous Acquisition of Spatial Harmonics (SMASH): Fast Imaging with Radiofrequency Coil Arrays," Magn Reson Med., 1997, pp. 591-603, 38(4), Williams & Wilkins.

Sumbul, U. et al., "A Practical Acceleration Algorithm for Real-Time Imaging," IEEE Trans Med Imaging, 2009, pp. 2042-2051, 28(12), IEEE.

Sumbul, U. et al., "Improved Time Series Reconstruction for Dynamic Magnetic Resonance Imaging," IEEE Trans Med Imaging, 2009, pp. 1093-1104, 28(7), IEEE.

Tsao, J. et al., "k-t BLAST and k-t SENSE: Dynamic MRI With High Frame Rate Exploiting Spatiotemporal Correlations," Magn Reson Med., 2003, pp. 1031-1042, 50(5), Wiley-Liss, Inc.

* cited by examiner

SYSTEMS AND METHODS FOR CARTESIAN DYNAMIC IMAGING

CROSS-REFERENCE TO RELATED PATENT APPLICATIONS

This application claims priority to and the benefit of, pursuant to 35 U.S.C. § 119(e), U.S. provisional patent application Ser. No. 61/636,501, filed Apr. 20, 2012, entitled "System and Method for Kalman Filter Techniques for Accelerated Cartesian Dynamic Cardiac Imaging," by Xue Feng and Craig H. Meyer, the contents of which is incorporated herein in its entirety by reference.

Some references, which may include patents, patent applications, and various publications, are cited in a reference list and discussed in the disclosure provided herein. The citation and/or discussion of such references is provided merely to clarify the description of the present disclosure and is not an admission that any such reference is "prior art" to any aspects of the present disclosure described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [4] represents the 4th reference cited in the reference list, namely, Rehwald et al., "Theory of high-speed MR imaging of the human heart with the selective line acquisition mode." Radiology 2001; 220(2):540-547.

STATEMENT AS TO RIGHTS UNDER FEDERALLY-SPONSORED RESEARCH

This invention was made with government support under Grant HL079110, awarded by the National Institutes of Health. The government has certain rights in the invention.

BACKGROUND

In dynamic MRI, spatial and temporal parallelism can be exploited to reduce scan time. Real-time reconstruction is sometimes necessary for timely feedback during the scan. Conventional view sharing techniques suffer from reduced temporal resolution and many advanced reconstruction methods, including current methods based on compressed sensing, are either retrospective or too time-consuming, or both. Some original applications of dynamic MRI were limited to non-Cartesian trajectories because of assumptions made in the model to make the computation feasible.

Conventional methods using retrospective reconstruction are not adopted largely in clinical applications in which real-time reconstruction is required, such as real-time catheter tracking and cardiac stress function studies. Furthermore, conventional methods are not always robust; for example, in real-time cardiac imaging, the effectiveness of some conventional methods can be impaired by respiratory motion during free breathing [11].

It is with respect to these and other considerations that the various embodiments described below are presented.

SUMMARY

The present disclosure relates generally to magnetic resonance imaging (MRI), and particularly to systems and methods for Cartesian dynamic imaging to increase spatial and temporal resolution in dynamic MRI. In one aspect, a method for Cartesian dynamic imaging is disclosed. In one example embodiment, the method includes acquiring magnetic resonance data for an area of interest of a subject that is associated with a physiological activity of the subject, and performing image reconstruction including Kalman filtering or smoothing on Cartesian images associated with the acquired magnetic resonance data, wherein the image reconstruction can include increasing at least of spatial and temporal resolution of the Cartesian images.

In another aspect, a system for Cartesian dynamic imaging is disclosed. In one example embodiment, the system includes a magnetic resonance imaging (MRI) device and one or more processors. At least one memory device that is in communication with the MRI device can store computer-readable instructions that, when executed by the one or more processors cause the system to acquire magnetic resonance data for an area of interest of a subject that is associated with a physiological activity of the subject. When executed by the one or more processors, the instructions further cause the system to perform image reconstruction using Kalman filtering or smoothing on Cartesian images associated with the acquired magnetic resonance data. Performing the image reconstruction can include increasing at least one of spatial and temporal resolution of the Cartesian images.

In yet another aspect, a computer-readable medium is disclosed. In one example embodiment, the computer-readable medium has stored computer-executable instruction that, when executed by one or more processors, cause a computer to perform functions that include. acquiring magnetic resonance data for an area of interest of a subject that is associated with one or more physiological activities of the subject. The functions also include performing image reconstruction using Kalman filtering or smoothing on Cartesian imagines associated with the acquired magnetic resonance data. The image reconstruction can include increasing at least one of spatial and temporal resolution of the Cartesian images.

Other aspects and features of embodiments of the present disclosure will become apparent to those of ordinary skill in the art, upon reviewing the following detailed description in conjunction with the accompanying figures.

BRIEF DESCRIPTION OF THE DRAWINGS

The patent or application filed contains at least one drawing executed in color. Copies of this patent or patent application publication with color drawing(s) will be provided by the Office upon request and payment of the necessary fee.

FIG. 4 illustrates reconstructed images of a phantom study (top row) and the image intensities alone the red vertical line vs. time (bottom row) using the sliding window, SLAM, and Kalman filter methods. The three pairs of concentric circles are with fixed radius, slowing oscillating radius and rapidly oscillating radius (from left to right). The Kalman filter method substantially reduces aliasing and temporal blurring. The reduction in temporal blurring can be seen in the sharper temporal response and the reduced blurring of the boundaries between regions of the phantom.

DETAILED DESCRIPTION

Figure 1:
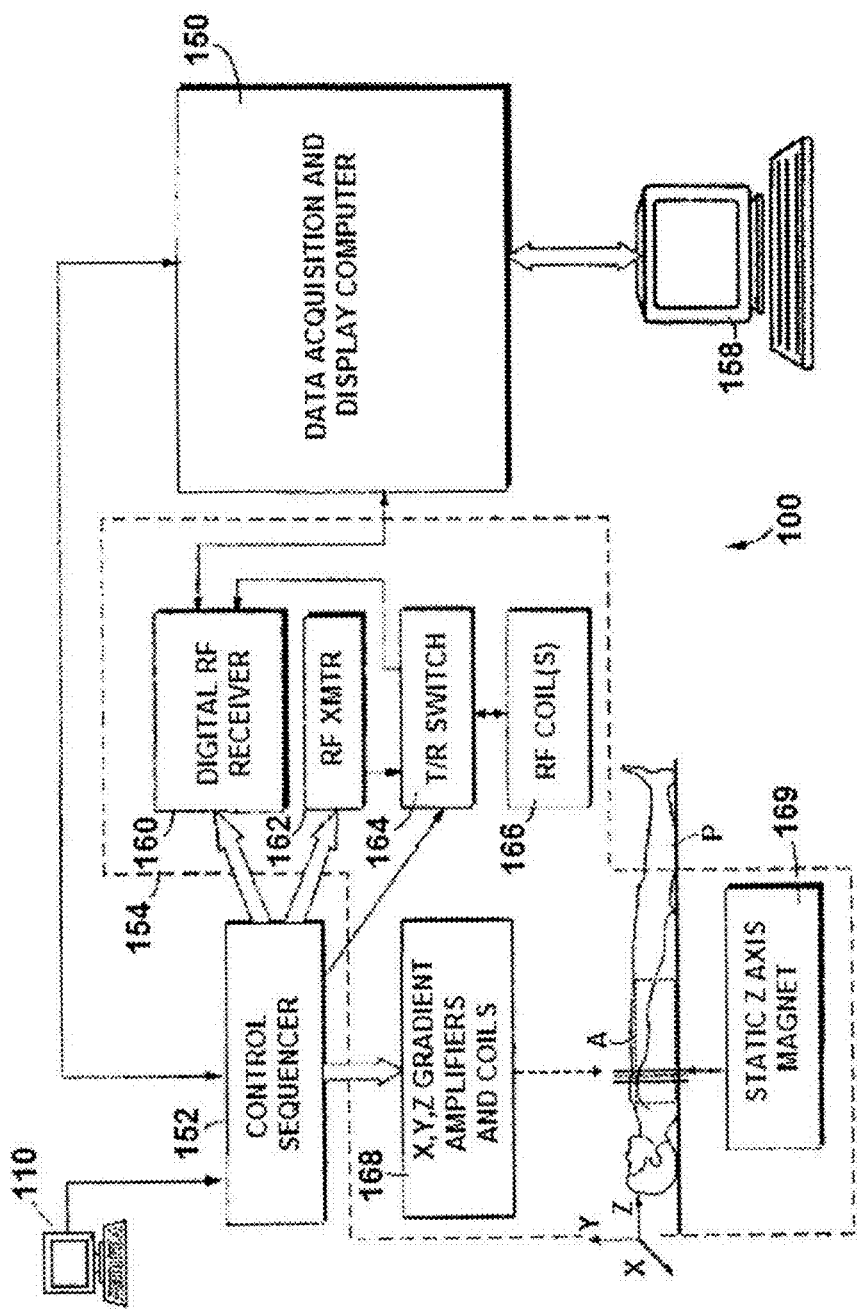
FIG. 1 is a system diagram illustrating an operating environment capable of implementing aspects of the present disclosure in accordance with one or more example embodiments.

Embodiments of the disclosed technology relate to systems and methods for Cartesian dynamic imaging to provide for, among other advantages and benefits, increasing spatial and temporal resolution in dynamic magnetic resonance imaging (MRI). Dynamic MRI, which acquires a series of magnetic resonance images to capture evolving physiological phenomena, is used in clinical applications including real-time cardiac function imaging, myocardial perfusion imaging, dynamic MRA and functional MRI. Short scan time is typically needed to reduce motion artifacts in dynamic imaging. One method for reducing scan time is to exploit the redundancy in the acquired data and/or the raw images so that less k-space data are required for a given spatial and temporal resolution. Parallel imaging techniques, such as SMASH [1], SENSE [2] and GRAPPA [3], can reduce scan time without degrading image quality, taking advantage of the spatial redundancy of the image with multiple receiver coils to reduce the amount of k-space data required.

Similarly, in most dynamic image series, temporal redundancy can be also exploited, since the images are highly correlated. Various view-sharing techniques can make use of the temporal redundancy to reduce the number of k-space phase-encoding lines acquired for each image. These include the sliding window, which fills the unacquired k-space data with the previously acquired time-adjacent k-space data, and SLAM [4], which fills the unacquired k-space data by interpolating from neighboring frames. These techniques, provided in a clinical setting, can be simple and robust, although they can only increase the apparent temporal resolution and may introduce temporal blurring and ghost artifacts to the dynamic image series.

Rather than exploiting the redundancy in the time domain, a 1D Fourier transform, used along the time direction, can be used to exploit the redundancy in the frequency domain and then use advanced reconstruction methods to recover the image series. These approaches can include UNFOLD [5], kt-BLAST [6] and kt-FOCUSS [7], and they may show advantages over the view sharing techniques in reducing aliasing and temporal blurring. Another category includes reduced FOV (rFOV) methods [8-10], which take advantage of the fact that some parts in the FOV are relatively static in a dynamic image series so that the number of required k-space lines to update an individual image can be reduced. One representative method called Noquist [10] can effectively reconstruct the image series without residual artifacts from undersampled k-space data by decomposing the image and the corresponding Fourier transform matrix into dynamic and static parts and solving the resulting inverse problem with greatly reduced degrees of freedom, because the static part of the image series stays the same throughout the image series and requires much less data to reconstruct. Techniques based on compressed sensing, including the aforementioned kt-FOCUSS and temporally constrained reconstruction methods [12] exploit sparsity in the time and/or frequency domain. These methods may require a long reconstruction time due to the iterative reconstruction, and as a result, a physician may not get the reconstructed images for rapid feedback during the scan. Also, nonlinear characteristics of these techniques may prove difficult for predicting and evaluating the noise in the images compared with linear methods.

Spatial and temporal redundancy can be exploited in combination to effectively reduce the scan time during dynamic MR imagine. Some spatiotemporal acceleration approaches include TSENSE [15] and TGRAPPA [16], which mainly rely on spatial parallelism but improve the results with the temporal information; kt-SENSE [6], which is an expansion of kt-BLAST that incorporates coil sensitivity into the model; and PINOT [17], which combines the SPACE-RIP parallel imaging method [18] and the Noquist method.

The Kalman filter, a method used in many engineering fields including real-time object tracking, can also exploit the temporal redundancy in a time series by describing the dynamic problem with a time-evolving state model and rapidly estimating the current state using a real-time linear filtering process. Therefore, it is plausible to use this method in dynamic MRI for real-time imaging and real-time reconstruction. The original adoption of Kalman filter in dynamic MRI was proposed by Sümbül et al. [13-14]. However, this method was confined to non-Cartesian k-space trajectories because of a limitation intrinsic to the model used in that study.

Although exemplary embodiments of the present disclosure are explained in detail, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise.

In describing exemplary embodiments, terminology will be resorted to for the sake of clarity. It is intended that each term contemplates its broadest meaning as understood by those skilled in the art and includes all technical equivalents that operate in a similar manner to accomplish a similar purpose.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

Ranges may be expressed herein as from "about" or "approximately" one particular value and/or to "about" or "approximately" another particular value. When such a range is expressed, another embodiment includes from the one particular value and/or to the other particular value. As used herein, "about" means within 20 percent or closer of a given value or range.

As discussed herein, a "subject" or "patient" may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to a human (e.g. rat, dog, pig, monkey), etc. It should be appreciated that the subject may be any applicable human patient, for example.

It is also to be understood that the mention of one or more steps of a method does not preclude the presence of additional method steps or intervening method steps between those steps expressly identified. Method steps may be performed in a different order than those described herein. Similarly, it is also to be understood that the mention of one or more components in a device or system does not preclude the presence of additional components or intervening components between those components expressly identified.

The following detailed description is directed to systems and methods for Cartesian dynamic imaging. In the following detailed description, references are made to the accompanying drawings that form a part hereof and that show, by way of illustration, specific embodiments or examples. In referring to the drawings, like numerals represent like elements throughout the several figures.

FIG. 1 is a system diagram illustrating an operating environment capable of implementing aspects of the present disclosure in accordance with one or more example embodiments. Embodiments may be implemented on a commercial MRI system. FIG. 1 illustrates an example of such an MRI system 100, including a data acquisition and display computer 150 coupled to an operator console 110, a MRI real-time control sequencer 152, and a MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158.

The area of interest A corresponds to a region associated with one or more physiological activities in patient P. The area of interest shown in the example embodiment of FIG. 1 corresponds to a chest region of patient P. It will be appreciated that area of interest A can additionally or alternatively correspond to, but is not limited to, one or more of a brain region, cardiac region, and upper or lower limb regions of the patient P. Display 158 may be implemented through a variety of output interfaces, including a monitor, printer, or data storage. It will be appreciated that any number and type of computer-based tomography imaging systems or components, including various types of magnetic resonance imaging systems, may be used to practice aspects of the present disclosure, and the disclosure should not be limited to the type of MRI subsystem shown in FIG. 1.

Figure 2:
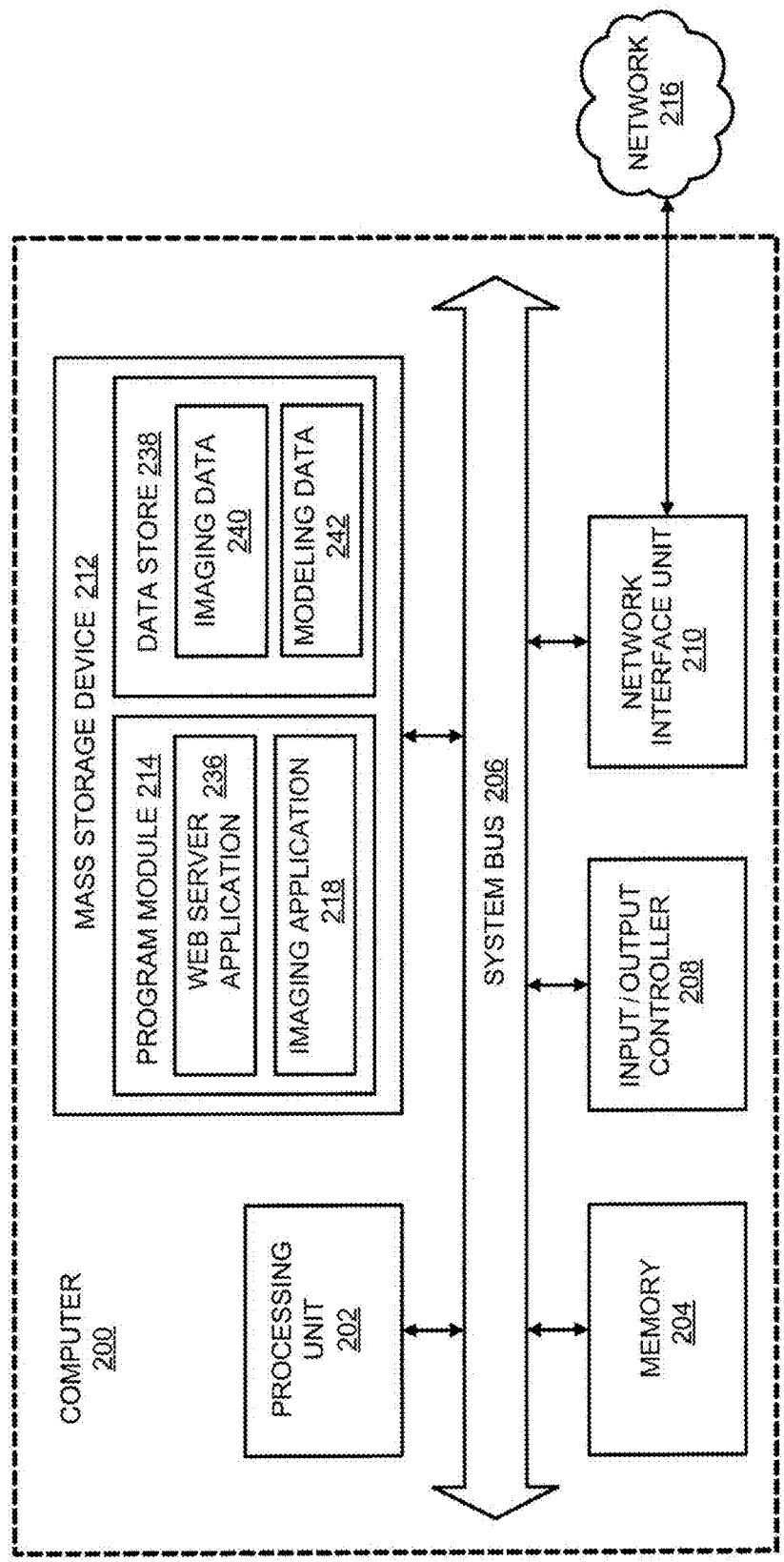
FIG. 2 is a computer architecture diagram showing illustrative computer hardware architecture for a computing system capable of implementing aspects of the present disclosure in accordance with one or more example embodiments.

FIG. 2 is a computer architecture diagram showing illustrative computer hardware architecture for a computing system capable of implementing aspects of the present disclosure in accordance with one or more example embodiments described herein. An example implementation of the computer 200 may include the data acquisition and display computer 150 of FIG. 1. The computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform various operations discussed below with respect to FIGS. 3-10 and may include a web server application 236 and an imaging application 218. The computer can include a data store 238 for storing data that may include imaging-related data 240 such as image acquisition data, and a modeling data store 242 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory 10 technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200.

According to various embodiments, the computer 200 may operate in a networked environment using logical connections to remote computers through a network 216. The computer 200 may connect to the network 216 through a network interface unit 210 connected to the bus 206. It should be appreciated that the network interface unit 210 may also be utilized to connect to other types of networks and remote computer systems. The computer 200 may also include an input/output controller 208 for receiving and processing input from a number of input devices. The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like.

The computer-storage media may represent memory components, whether characterized as RAM, ROM, flash, or other types of technology. The computer-storage media may also represent secondary storage, whether implemented as hard drives or otherwise. Hard drive implementations may be characterized as solid state, or may include rotating media storing magnetically-encoded information. The program modules 214, which include the imaging application 218, may include software instructions that, when loaded into the processing unit 202 and executed, cause the computer 200 to provide functions for Cartesian dynamic imaging, according to aspects of the present disclosure described herein in accordance with example embodiments. The program modules may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include, but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Figure 3:
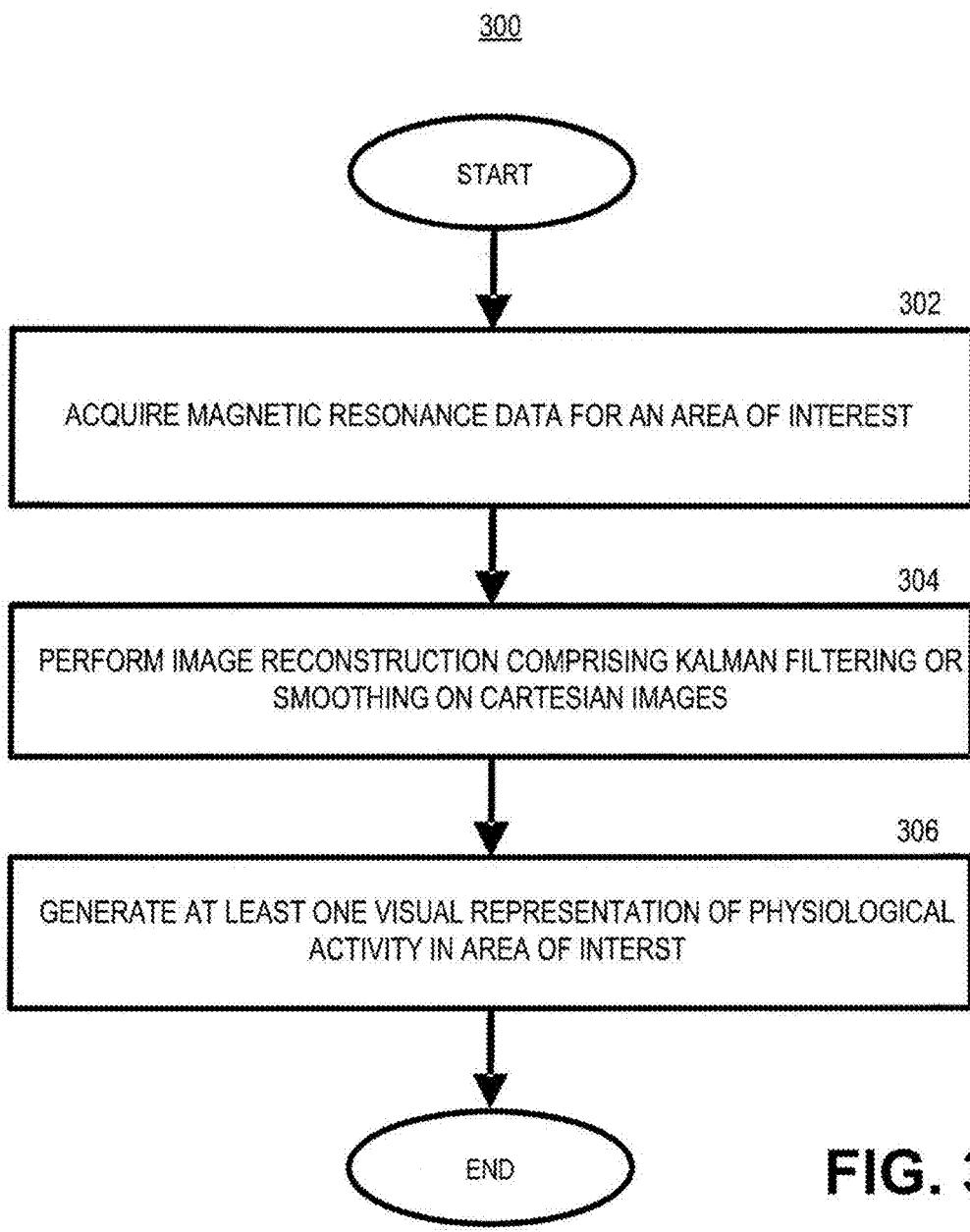
FIG. 3 is a flow chart illustrating operations of a method for dynamic Cartesian imaging implementing Kalman filtering or smoothing techniques in accordance with one or more example embodiments.

FIG. 3 illustrates operational steps of a method 300 for Cartesian dynamic imaging, according to an exemplary embodiment of the present disclosure. The method 300 begins at block 302, where magnetic resonance data can be acquired. In one embodiment, the MR data can be for an area of interest of a subject that is associated with a physiological activity of the subject. At block 304, image reconstruction can be performed on Cartesian images associated with the acquired MR data. In an embodiment, the image reconstruction can include Kalman filtering or smoothing. At block 306, the method can further include generating, based on the Cartesian image reconstruction, at least one visual representation, for presentation on a display, of the physiological activity in the area of interest of the subject.

As shown in block 302, acquiring the magnetic resonance data can include acquiring a Cartesian dynamic image series associated with the area of interest.

In another embodiment, as shown in block 304, performing the image reconstruction can include performing non-iterative image reconstruction. In yet another embodiment, performing the image reconstruction can include linear filtering in real-time.

In certain embodiments, performing the image reconstruction can include estimating a current state of the area of interest based on image data corresponding to a past state of the area of interest, based on at least one of temporal and spatial redundancies.

As shown in block 306, in one embodiment, the physiological activity can include cardiac activity. One of ordinary skill in the art would recognize that imaging various physiological activities can be contemplated by the present disclosure, and thus not limited to cardiac activity.

Another embodiment of the disclosure can be a system. In an exemplary embodiment, the system can include a magnetic resonance imaging (MRI) device and one or more processors. In another embodiment, the least one memory in communication with the MRI device can store computer-readable instructions that, when executed by the one or more processors can cause the system to acquire magnetic resonance data for an area of interest of a subject that is associated with a physiological activity of the subject. In yet another embodiment, image reconstruction can be performed that can include Kalman filtering or smoothing on Cartesian images associated with the acquired magnetic resonance data. In another aspect of the disclosure, the image reconstruction can include increasing at least one of spatial and temporal resolution of the Cartesian images.

In one embodiment, acquiring the magnetic resonance data can include acquiring a Cartesian dynamic image series associated with the area of interest. In an alternative embodiment, performing the image reconstruction can include performing non-iterative image reconstruction. In yet another embodiment, performing the image reconstruction can include linear filtering in real-time.

In certain embodiments, performing the image reconstruction can include estimating a current state of the area of interest based on image data corresponding to a past state of the area of interest, based on at least one of temporal and spatial redundancies. In other embodiments, the method can further include generating, based on the Cartesian image reconstruction, at least one visual representation, for presentation on a display, of the physiological activity in the area of interest of the subject. In one embodiment, the physiological activity can include cardiac activity.

Another aspect of the disclosure can be a computer-readable storage medium having stored computer-executable instruction that, when executed by one or more processors, cause a computer to perform functions. In one embodiment, the functions can include acquiring magnetic resonance data for an area of interest of a subject that is associated with a physiological activity of the subject. In another embodiment, the functions can include performing image reconstruction that can include Kalman filtering or smoothing on Cartesian imagines associated with the acquired magnetic resonance data. In yet another embodiment, the image reconstruction can include increasing at least one of spatial and temporal resolution of the Cartesian images.

In one embodiment, acquiring the magnetic resonance data can include acquiring a Cartesian dynamic image series associated with the area of interest. In an alternative embodiment, performing the image reconstruction can include performing non-iterative image reconstruction. In yet another embodiment, performing the image reconstruction can include linear filtering in real-time.

In certain embodiments, performing the image reconstruction can include estimating a current state of the area of interest based on image data corresponding to a past state of the area of interest, based on at least one of temporal and spatial redundancies. In other embodiments, the method can further include generating, based on the Cartesian image reconstruction, at least one visual representation, for presentation on a display, of the physiological activity in the area of interest of the subject. In one embodiment, the physiological activity can include cardiac activity.

EXAMPLE IMPLEMENTATIONS AND RESULTS

The following describes examples of practicing concepts and technologies presented herein, and corresponding results, in accordance with aspects of the present disclosure.

Example 1

The Kalman filter model can be combined with spatial parallel techniques. If reliable coil sensitivity maps can be acquired, they can simply incorporate them into the model as in kt-SENSE and non-Cartesian Kalman filter combined with SENSE [13]; however, since accurate coil sensitivity maps in many dynamic problems are difficult to achieve, the Kalman filter can also be combined with TGRAPPA to avoid the coil sensitivity estimation step.

Furthermore, the Kalman filter can be implemented in Cartesian dynamic MRI, including the combination with parallel imaging techniques. These methods can apply to myriad dynamic imaging areas of interest including, but not limited to cardiac, thoracic, intracranial, brain, etc. . . . These methods can also be contemplated for non-gated real-time cardiac imaging.

The systems and methods of the present disclosure have several distinct advantages that allow their adoption in many clinical applications in which real-time reconstruction is required (e.g., real-time catheter tracking and cardiac stress function studies). Specifically, the systems and methods can be robust and may not be impaired by respiratory motion during free breathing. Furthermore, major advantages of the present disclosure can include the capability for non-iterative real-time reconstruction and significantly improved temporal resolution.

Theory

In general, a Kalman filter model is composed of a system model that describes the relationships among the time-evolving states and a measurement model that describes the measurement of the state at a given time. Usually the current measurement at a given time alone is not sufficient to obtain an accurate estimate of the current state. The key to the Kalman filter is to use all previous measurements and the relationship between states as described by the system model to estimate the current state. Furthermore, the estimation process is recursive, so there is no need to store past measurements for the purpose of computing present estimates. Thus, the process can be very fast and memory efficient. The general model of a Kalman filter is given as follows [19]:

$$\underline{x}_k = \Phi_{k-1}\underline{x}_{k-1} + \underline{w}_{k-1}, \underline{w}_k \sim N(\underline{0}, Q_k)$$

$$\underline{z}_k = H_k\underline{x}_k + \underline{v}_k, \underline{v}_k \sim N(\underline{0}, R_k) \quad [1]$$

where $\underline{x}_k$ is the system state in a vector form, $\Phi_k$ is the state transition matrix, $\underline{w}_k$ is the system noise vector assumed to have a zero-mean Gaussian distribution with covariance matrix $Q_k$, $H_k$ and $\underline{z}_k$ are the measurement matrix and the corresponding measurement data, and $\underline{v}_k$ is the measurement noise also assumed to have a zero-mean Gaussian distribution with covariance matrix $R_k$. Given the appropriate initial conditions and assuming $\underline{w}_k$ and $\underline{v}_j$ are independent, one can get the state estimate $\hat{\underline{x}}_k$ by a prediction-correction process described as $$\hat{\underline{x}}_k^- = \Phi_{k-1}\hat{\underline{x}}_{k-1}^+$$

$$\hat{\underline{x}}_k^+ = \hat{\underline{x}}_k^- + K_k[\underline{z}_k - H_k\hat{\underline{x}}_k^-] \quad [2]$$

where the − and + refer to the predicted and corrected state estimates and $K_k$ is the Kalman gain matrix calculated from $H_k$, $Q_k$, $R_k$ and $\Phi_k$ [19]. The general equations to calculate $K_k$ are omitted here for brevity, as they will be discussed below in the Model Implementation section.

For directly applying the Kalman filter model to a dynamic MRI application acquiring a 2D image series, the state to be estimated at each time point k is one individual image from the image series and the corresponding measurement is the acquired k-space data, where the measurement matrix is the 2D Fourier transform in matrix form. One obstacle here is the size of the vectors and matrices. For an individual N by N image, the dimension of the state vector is $N^2 * 1$ and the corresponding matrix is $N^2 * N^2$, which is generally too large to handle for a typical value of N. In Sümbül's paper [13], a diagonalization assumption is made for $Q_k$, $R_k$ and $H_k^T H_k$ so that the prediction-correction process can be performed on a pixel-by-pixel basis to bypass the matrix multiplication and inversion steps in calculating $K_k$. The diagonalization of $Q_k$ and $R_k$ can still be applied for Cartesian trajectories, because $Q_k$ reflects statistical properties of the dynamic image series that are independent from the data acquisition, and the diagonalization of $R_k$ is intrinsic due to the whiteness of the measurement noise.

However, the diagonal simplification for $H_k^T H_k$ is only possible for a non-Cartesian k-space trajectory such as a spiral trajectory. Assuming $H_k$ is the undersampled 2D Fourier transform matrix connecting the image domain and the k-space domain with a matrix-vector multiplication, the off-diagonal terms of $H_k^T H_k$ are determined by the aliasing pattern as displayed in the point spread function. For a spiral trajectory, the aliasing is diffuse and the side lobes of the point spread function are more evenly distributed; therefore, each single off-diagonal term is very small compared to the diagonal term and can be ignored without nullifying the model. However, for a Cartesian k-space trajectory, the aliasing pattern is generally very conspicuous as shown by separate peaks in the point spread function; therefore, the off-diagonal term of $H_k^T H_k$ cannot be ignored. Without the diagonalization of $H_k^T H_k$, the direct implementation of the Kalman filter is impractical since the matrix calculation process can be extremely complicated and will greatly increase the reconstruction time. However, in an undersampled 2D Cartesian k-space measurement, undersampling usually only happens in the phase encoding direction and k-space is often fully sampled or even over sampled in the readout direction. Therefore, a direct 1D Fourier transform can first be performed along the readout direction and then the Kalman filter can be used for the reconstruction along the phase encoding direction for each readout pixel. By doing that, for the same N by N image, N Kalman filter models result which can be calculated in parallel and for each model, the dimension of the state vector becomes N and the matrix size becomes reasonable. Furthermore, since there has already been transformation into the image domain along the readout direction before the Kalman filter model implementation, in many cases fewer than N Kalman filter models can be needed to cover the ROI along the readout direction, because portions of the object may not experience rapid motion. In this case, view-sharing techniques can be used for the remaining regions to further reduce the reconstruction time, as discussed below.

The following paragraphs focus on a particular application: non-gated real-time imaging of cardiac function. A specific Kalman filter model is described, to use this model to perform image reconstruction from undersampled data. Cardiac imaging has demanding requirements for a dynamic imaging method, because of the fast and complex motion of the heart combined with chest motion from breathing. First, implementation of the Kalman filter model is introduced, and then obtaining the signal estimates is described. Algorithms to simplify the model will then be discussed for reducing the reconstruction time. The combination of the Kalman filter with parallel imaging techniques will then be discussed.

Model Implementation

In a dynamic cardiac image series, the differences between two consecutive images are generally very small except for certain areas experiencing rapid changes; therefore, for simplicity, it can be assumed that the state transition matrix is an identity matrix and the difference can be modeled as system noise having a zero-mean Gaussian distribution [13]. In fact, the variance of this system noise can represent the degree of variation at each corresponding pixel as the absolute value of the image differences are generally larger in more dynamic areas and smaller in less dynamic areas.

Therefore, together with the 1D simplification, the Kalman filter model for real-time cardiac function imaging can be written as:

$$\underline{x}_k = \underline{x}_{k-1} + \underline{w}_{k-1}, \underline{w}_k \sim N(\underline{0}, Q_k)$$

$$\underline{z}_k = F_k \underline{x}_k + \underline{v}_k, \underline{v}_k \sim N(\underline{0}, R_k) \qquad [3]$$

where $\underline{x}_k$ is simplified to be the image column vector assuming the row vector is along the readout direction for the 2D image, $\underline{w}_k$ is the system noise vector with covariance matrix $Q_k$, $F_k$ is the 1D Fourier transform matrix, $\underline{z}_k$ is the corresponding k-space data column vector after the 1D Fourier transform along the readout direction, and $\underline{v}_k$ is the measurement noise with covariance matrix $R_k$. Given the initial estimate $\hat{\underline{x}}_0$ and the initial estimation error covariance matrix $P_0$, the subsequent estimation $\underline{x}_k$ of is given as:

$$\hat{\underline{x}}_k^- = \hat{\underline{x}}_{k-1}^+$$

$$\hat{\underline{x}}_k^+ = \hat{\underline{x}}_k^- + K_k[\underline{z}_k - F_k \hat{\underline{x}}_k^-]$$

$$P_k^- = P_{k-1}^+ + Q_{k-1}$$

$$K_k = P_k^- F_k^T [F_k P_k^- F_k^T + R^k]^{-1}$$

$$P_k^+ = [I - K_k F_k] P_k^- \qquad [4]$$

where $P_k$ is the estimation error covariance matrix at each time step k and is a vital intermediate parameter to calculate the Kalman gain matrix $K_k$.

Parameter Estimation

From Equation [4] it can be seen that the parameters that can be estimated include the system noise covariance matrix $Q_k$, the measurement noise covariance matrix $R_k$, the initial state estimate $\hat{\underline{x}}_0$ and the initial estimation error covariance matrix $P_0$.

First, an assumption is made that the distributions of the system noise vector $\underline{w}_k$ and the measurement noise vector $\underline{v}_k$ do not change during the scan, because the dynamic process (e.g., periodic cardiac motion) is stable from a statistical point of view. With this assumption, $Q_k = Q$ and $R_k = R$ result. The estimation of Q and R are discussed below.

In Sümbül's paper [13], as discussed before, Q was assumed to be a diagonal matrix to simplify the computation process. This assumption was also validated in the paper by determining that the cross-correlation terms of Q were very small, as shown in FIG. 1 of [13]. The diagonal Q was then roughly estimated from a low spatial resolution training scan covering only the center of k-space or more precisely estimated from multiple training scans covering different portions of k-space in each scan.

In the disclosed model, the diagonal assumption of Q is not necessary from a computational point of view due to the 1D simplification; therefore, in theory it is possible to use a general covariance matrix Q in which the off-diagonal term can reflect the relationships among neighboring pixels to provide a better estimation of the image column vector $\underline{x}_k$. However, in practice, it is difficult to estimate Q, since no prior information about the distribution of $\underline{w}_k$ is given and thus one may rely solely on the sample observations of $\underline{w}_k$. From statistics, for an N-dimensional vector $\underline{w}_k$, the number of observations should be much greater than N to provide a reliable estimate of its covariance matrix Q. For MRI, N is usually very large and hence the amount of training data needed would be even larger, which would result in an extremely long training scan. Furthermore, the error in the estimation of a general covariance matrix Q can sometimes cause divergence of the Kalman filter model. On the other hand, if it is assumed that Q is a diagonal matrix and the cross-correlation terms are ignored, the estimation of Q becomes a pixel-by-pixel problem; only the variance of $w_k$ at each pixel needs to be estimated and the required sample observations can be greatly reduced. As compared with a potentially inaccurate general covariance matrix Q, a diagonal but more accurate Q is used in the disclosed model, and the accuracy of this simplification will be demonstrated in the simulation study described below.

To estimate the diagonal terms of Q, a low-resolution training scan is used that only acquires the center k-space lines. The fraction of the k-space lines acquired for the training is determined by the under sampling ratio in data acquisition so that the temporal resolution of the training images is the same as that of the actual images. Although the accuracy of the variance estimation can be impaired at sharp edges in the image with a low-resolution training scan due to blurring, the error in pixel variance estimation is acceptable, because the Kalman filter uses all previous measurements to arrive at the current estimate and thus exploits the overall redundancy of the k-space data.

An alternative way to estimate Q is to use multiple training scans to cover different parts of k-space, similar to the use of different spiral rings as introduced in [13]. However, this requires multiple training scans and thus greatly increases the scan time. Furthermore, the effect of this more precise Q is not obvious in terms of the accuracy of the state vector estimate, which is our ultimate goal. Therefore, it is preferred to use the low-resolution training scan to get Q. The accuracy of this approach will also be demonstrated in the simulation study described below.

In the disclosed estimation process, differences between magnitude images are used rather than complex images to estimate the variance at each pixel. When using complex differences, differences in phase that result from off-resonance, motion or noise between consecutive training images can significantly increase the variance and thus make the estimate unreliable. This is especially true in regions where the image magnitude is small. The measurement noise can also affect the estimation of Q, but this can be corrected as described in the following paragraph. To estimate $R_k$, the diagonal and time-invariant assumptions can be used, since the measurement noise can be regarded as independent white noise and does not change with time. Therefore, $R_k = R = \sigma^2 I$ is obtained, where I is the identity matrix. It is necessary to mention that this noise is not the original 2D k-space measurement noise but the noise after a 1D Fourier transform along the readout direction; however, since the Fourier transform is an orthonormal transform, the whiteness of the noise is maintained. As discussed before, the estimation of Q is contaminated with measurement noise because the training data measurement is not noise-free and the noise is brought into the training images via the Fourier transform. Assuming the raw estimation of Q is given as $Q_{raw}$, it can be derived that $Q = Q_{raw} - 2c\sigma^2 I$, where c is a constant determined by the normalization factor of the Fourier transform. To jointly correct for the contamination of measurement noise to get Q and estimate the noise level $\sigma$, the assumption can simply be made that the minimum diagonal term of Q is close to zero, because there exists at least one pixel that stays almost the same during the dynamic process and consequently, the minimum diagonal term in $Q_{raw}$ is due to the measurement noise. So we can get the estimate of $\sigma$ and the corrected Q.

Finally, the model can be initialized with the initial conditions of $\hat{x}_0$ and its estimation error covariance matrix $P_0$. It is impossible to provide an accurate and alias-free initial image due to limited temporal and spatial resolution. The options are either the spatially-blurred image from the low-resolution training scan or the temporally-blurred image reconstructed using view sharing techniques. However, since the Kalman filter is a robust filter that can correct for the inaccuracy in the initial estimates with more and more measurements, the influence of the inaccuracy of the initial image will fade away; therefore, an initial image with faster convergence is chosen. The performance of these two options are compared with the simulation study described in the following sections. Similarly, the inaccuracy in $P_0$ will also be corrected by the Kalman filter; therefore, it is just empirically chosen to be Q multiplied by the undersampling ratio, because the estimation error of $\hat{x}_0$ at one pixel is roughly proportional to the variance of that pixel and the undersampling factor.

Simplifications of the Kalman Filter Model

From Equation [4] it can be seen that the most time-consuming step is the calculation of the Kalman gain matrix $K_k$ and the intermediate parameter $P_k$. However, as discussed before, the system noise covariance matrix Q and the measurement noise covariance matrix R are assumed to be time-invariant; therefore, the only matrix that changes from step to step involved in calculation of $K_k$ and $P_k$ is the measurement matrix F. If the k-space sampling pattern is periodic over the entire image series, the corresponding matrix $F_k$ is also periodic. Because $P_0$ is a manually chosen parameter, the Kalman gain matrix $K_k$, as well as $P_k$, will gradually converge to a periodic steady state after several steps. After that, the update of $K_k$ using Equation [4] can be replaced by using the pre-calculated periodic $K_k$. The reconstruction time can thus be greatly reduced. The convergence of $K_k$ is demonstrated with the simulation study in the following sections.

In addition, as discussed before, the Kalman filter model does not have to be used for every phase encoding line. Each phase encoding line corresponds to one readout location after the 1D Fourier transform along the readout direction. If this phase encoding line is within a static or slowly-varying area, the simple view sharing methods are sufficient to reconstruct this line without aliasing, and thus the reconstruction time can be reduced. Instead of retrospectively selecting these areas, Q can provide this information, because in static or slowly varying areas the corresponding variance is very small compared to that in more dynamic areas. Specifically, the variance vector $Q_l$ is examined that corresponds to each readout location and determine whether $\max(Q_l) < Q_{mean}/2$, where $Q_{mean}$ is the mean variance across the entire 2D image. If this is true, then a linearly interpolated view sharing method (SLAM) is used instead of the Kalman filter model. The effect of this simplification is examined in the simulation study below.

Multiple Coils

If multiple receiver coils are available, the Kalman filter model can be extended to incorporate the measurements from different coils by combining the Kalman filter with SENSE. If the coil sensitivity map is available, the data from different coils can be includes, which results in the following model [13]:

$$\underline{x}_k = \underline{x}_{k-1} + \underline{w}_{k-1}, \underline{w}_k \sim N(\underline{0}, Q_k) \quad (5)$$

$$\begin{bmatrix} z_{k1} \\ z_{k2} \\ \vdots \\ z_{kn} \end{bmatrix} = \begin{bmatrix} F_k S_{k1} \\ F_k S_{k2} \\ \vdots \\ F_k S_{kn} \end{bmatrix} \underline{x}_k + \begin{bmatrix} v_{k1} \\ v_{k2} \\ \vdots \\ v_{kn} \end{bmatrix}, \underline{v}_{ki} \sim N(\underline{0}, R_{ki})$$

where n is the number of receiver coils and $S_{kn}$ is the coil sensitivity map. For generality, the coil sensitivity map is assumed to be time-variant, because in imaging during free breathing, the chest motion can cause the coil elements to move. To dynamically estimate the coil sensitivity map, the coil images reconstructed with view sharing techniques can be used. Correct normalization of the coil sensitivity map is important to avoid divergence of the Kalman filter solution. The disadvantages of using this SENSE-based method include difficulty in accurately estimating the coil sensitivity map in dynamic imaging and greatly increased computation. The computation increases because the dimension of the measurement model is increased by n and the periodic property of the Kalman gain matrix $K_k$ is lost, because the measurement matrix is no longer periodic due to non-periodic $S_{kn}$. Therefore, a method of combining the Kalman filter with GRAPPA is developed to more effectively use the multi-coil measurements.

Compared with traditional GRAPPA, TGRAPPA is advantageous in dynamic cardiac imaging since no separate training step is required and the GRAPPA kernel is updated for every frame in the image series [16]. In the disclosed model, first the updated GRAPPA kernel is used to fill all the missing k-space lines for each individual coil. Given that the filled k-space data is not accurate enough to generate an alias-free and high SNR image when the undersampling ratio is very high if one just does a Fourier transform and combines the coil images, as in TGRAPPA. However, this approximate k-space data can still be input into the modified Kalman filter model as follows:

$$x_k = x_{k-1} + w_{k-1}, w_k \sim N(0, Q_k) \quad [6]$$

$$\begin{bmatrix} z_k \\ z_{k\_TG} \end{bmatrix} = Fx_k + \begin{bmatrix} v_k \\ v_{k\_TG} \end{bmatrix}, \begin{bmatrix} v_k \\ v_{k\_TG} \end{bmatrix} \sim N\left(0, \begin{bmatrix} R_k & 0 \\ 0 & R_{k\_TG} \end{bmatrix}\right)$$

where is $z_k$ the measured k-space data and $z_{k\_TG}$ is the unacquired k-space data estimated from $z_k$ and the corresponding GRAPPA kernel; F, which replaces $F_k$ in the original model, is now the fully sampled 1D Fourier transform matrix, since $z_k$ and $z_{k\_TG}$ together cover all of k-space. It is worth mentioning that the measurement noise covariance matrix $R_{k\_TG}$ corresponding to $z_{k\_TG}$ is no longer determined by the actual k-space measurement noise since $z_{k\_TG}$ is not the measured k-space data. On the contrary, $R_{k\_TG}$ reflects the reliability of the filled k-space data using the GRAPPA kernel by considering the deviation of the filled k-space data from the "true" k-space data as noise. Similarly with $R_k$, for simplicity, $R_{k\_TG}$ is also assumed as white and time-invariant, given as $R_{k\_TG}=R_{TG}=p^2\sigma^2 I$, in which p describes the reliability of the filled data relative to the measurement noise. In fact, the off-diagonal terms of $R_{k\_TG}$ are not exactly zero as the missing k-space data points in one frame are generated using the same TGRAPPA kernel; the results might be more accurate with an approximate model to handle the noise related to TGRAPPA, but this is beyond the scope of this paper. Empirically, it is observed that $p=6r^2/n$, in which r is the undersampling ratio and n is the number of the coils. It is assumed that with a larger undersampling ratio, the standard deviation of the filled k-space data increases much faster and can be modeled with a square relationship. By this modified model, we can efficiently combine the spatial parallel information with the temporal model to give a better estimate of the dynamic image series. Also, with each coil, from Equation [4], the Kalman gain matrix $K_k$ can still converge to save reconstruction time, since $Q_k$, $R_k$ and $R_{k\_TG}$ are time-invariant and F is a constant.

Methods
Simulations

To verify the basic concept of the Kalman filter model in dynamic MRI, a numerical phantom study is first done by constructing a dynamic image series containing three pairs of concentric circles with fixed radius, slowly oscillating radius and rapidly oscillating radius, respectively. To simulate the data acquisition process using a Cartesian trajectory, calculation is made of the instant image at a given time point and its Fourier transform and the corresponding k-space data of one phase encoding line is selected assuming the actual measurement was done at that time point. The training data used for the Kalman filter model was simulated using the same method before the data acquisition. Then the simulated data set is reconstructed using sliding window, SLAM and the Kalman filter model with an acceleration factor of 2.

To study the effect of the Kalman filter model in reconstruction of undersampled data, a series of more realistic simulations are conducted, where the image series is reconstructed after retrospectively throwing out a portion of the k-space data and then the reconstructed image series is compared with the fully sampled data. The baseline image series were acquired using a balanced SSFP sequence in a real-time ungated cardiac MRI (CMR) study under both breath-hold and free-breathing situations. 2× TGRAPPA was used to increase the temporal resolution. A total of 80 frames covering approximately 9 heart cycles were generated. Then a Fourier transform is done for the baseline image series to get the fully sampled k-space data and manually undersampled that using a given sampling pattern with undersampling ratio 2 and/or 4. The training data for parameter estimation was also obtained from the fully-sampled k-space data of the first 40 frames by selecting the center ¼ of the k-space data.

To study the effect of Q in the Kalman filter model, in addition to the diagonalized Q estimated from the low-resolution training data, obtained are a diagonalized Q and a non-diagonalized Q with fully-sampled training data in which no manual undersampling was performed. The performance of the Kalman filter model using these three Q s was compared by calculating the root mean square differences between the reconstructed image series and the baseline image series. Similarly, to study the effect of the initial image in the Kalman filter model, the spatially-blurred initial image and the temporally-blurred initial image are used and compared the root mean square differences.

In addition, to test the simplifications of the Kalman filter model, the original Kalman filter model is implemented without any simplifications, the Kalman filter model with the convergent simplification and the Kalman filter model with the convergent simplification and combined with SLAM. Their performances are compared based on the root mean square differences.

For these simulations, a periodic sampling pattern is required when evaluating the convergence of the Kalman filter. Therefore, four types of sampling patterns satisfying the periodic requirement were used and their performance compared. For types I-III, the phase encoding line is first fixed order for a fully-sampled data set and then a subset of phase encodings is selected corresponding to one frame based on the undersampling factor. The subsets selected for Type I were interleaved, those for type II were bit-reversed, and those for type III were random. For type IV, a collection of random k-space lines were generated based on the undersampling factor and repeated this collection for every frame.

Finally, to compare the Kalman filter method with other available real-time reconstruction methods represented by the view sharing techniques, the sliding window method and SLAM were also implemented. Furthermore, kt-FOCUSS was used as a representative of iterative reconstruction methods based on compressed sensing, and it is compared with the Kalman filter method with the same undersampling factor but a Gaussian random undersampling pattern. In addition to the root mean square differences between the reconstructed image series and the baseline image series, the structural similarity index was also calculated, which measures the similarity between two images based on human eye perception to better estimate the performance of each reconstruction method.

Experiments

The non-gated real-time cardiac imaging experiments were performed on a Siemens Avanto 1.5 T scanner (Erlangen, Germany) equipped with a 12-channel body coil array and a 32-channel body coil array. Both coils were used in the experiments. A 2D Cartesian bSSFP sequence was used with sequence parameters as follows: TR=2.14 ms, TE=1.07 ms, FOV=380-400 mm, slice thickness=8 mm, flip angle=46°, # PE lines=128, # RO samples=128, image matrix size=128*128. A training scan of about 2.5 s was performed before the data acquisition to collect the center k-space lines. The total scan time was about 10 s. Both short axis and long axis views of the heart were imaged under breath held and free breathing conditions with acceleration factor 4. Array compression [20] was used for the primary coil data to simplify the calculation process for the large coil arrays. The data was then reconstructed using sliding window, SLAM, TGRAPPA, KF-SENSE and KF-TGRAPPA.

In order to independently assess the extent of spatial aliasing and to assess the image quality of rapid moving structures, two cardiologists (M.S. and C.M.K) graded the images for the severity of spatial aliasing and temporal blurring each on a 5-point scale. The ratings were then statistically analyzed with a two-tailed Wilcoxon test. For the spatial aliasing assessment a score of 1 corresponded to very severe aliasing precluding evaluation of myocardial function; 2 to severe aliasing but adequate to evaluate function; 3 to mild-moderate aliasing but not affecting region of interest; 4 to mild aliasing; and 5 to no aliasing. The perceived temporal blurring was graded as a score of 1 for virtually no temporal information; 2 for severe temporal blurring limiting ability to assess function; 3 for temporal blurring evident, but not affecting assessment of LV function; 4 for mild temporal blurring evident; and 5 for no temporal blurring. The image reviewers are both level III trained in CMR and have 6 and 20 years experience interpreting clinical CMR images.

Results

Simulations

Figure 4:
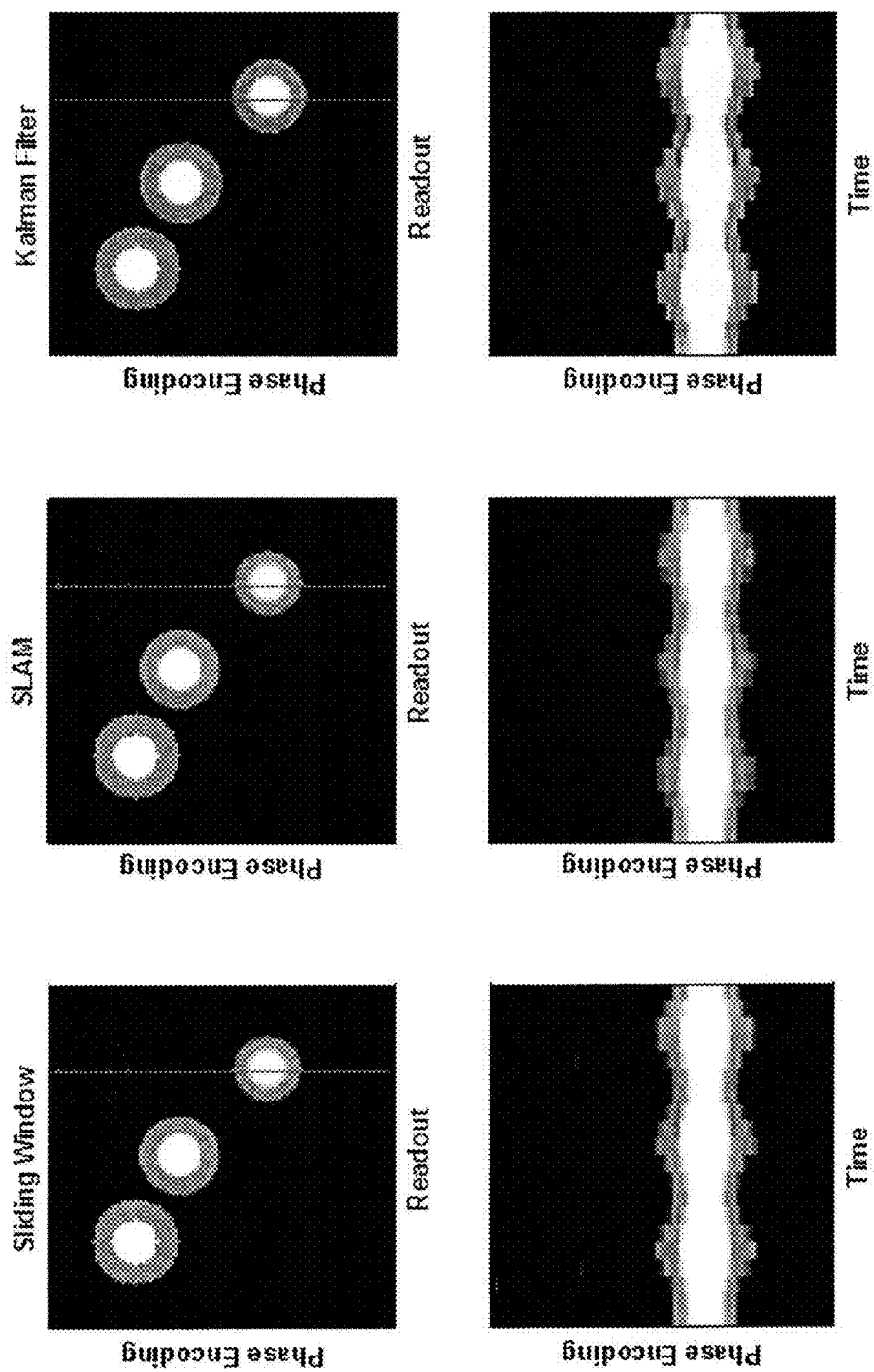
FIG. 4 illustrates one example of practicing concepts and technologies as described herein with respect to Example 1.

FIG. 4 gives the results for the numerical phantom simulation in which the reconstructed images at one time point (top row) and the image intensities along one vertical line versus time (bottom row) using sliding window, SLAM and the Kalman filter model are shown. The three pairs of concentric circles, from left to right, are with fixed radius, slowly oscillating radius and rapidly oscillating radius, and the red lines indicate the image cross-section displayed in the bottom row. The ghost artifacts due to the change in radius are very obvious with the sliding window and SLAM methods, but are greatly reduced with the Kalman filter model. In addition, the temporal resolution with the Kalman filter is much higher than with the two view sharing methods, as can be seen in the images in the bottom row. Temporal blurring can be seen both by the smoothing of the peaks as a function of time and by spatial blurring vertically between the white center region (simulated left ventricle) and the gray outer region (simulated myocardium). This improved temporal resolution comes from the fact that the Kalman filter model can distinguish the more dynamic areas from the less dynamic areas and hence more effectively use the undersampled data to catch the movement in the more dynamic areas.

Figure 5:
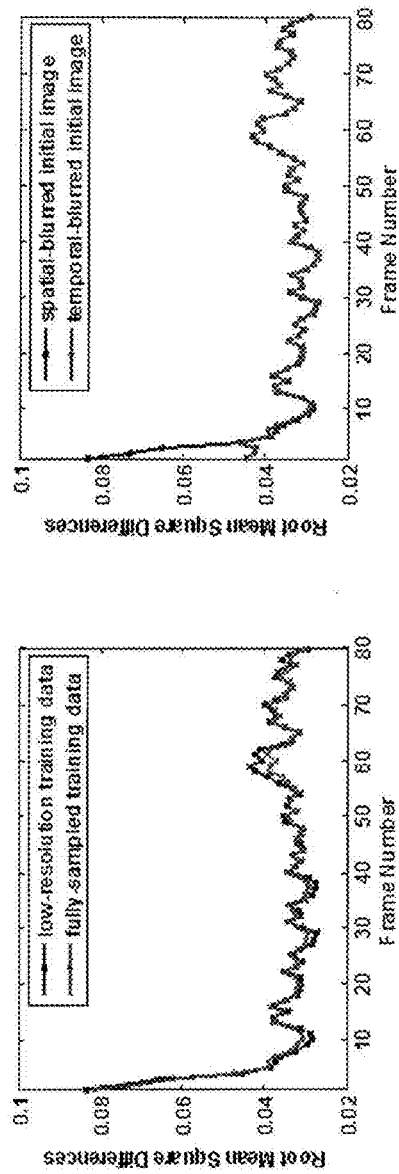
FIG. 5 illustrates root mean square differences of the Kalman filter model using different Q (left) and initial images (right) according to one example of practicing concepts and technologies as described herein with respect to Example 1.

FIG. 5 plots the root mean square differences between the reconstructed image series and the baseline image series using a diagonalized Q estimated from the low-resolution training data and from the fully-sampled training data (left) and using the spatially-blurred initial image and the temporally-blurred initial image. The reconstructed image series using a general Q estimated from the fully-sampled training data diverges, indicating the Kalman filter model fails with such an inaccurately estimated Q. The left side of FIG. 5 indicates that the result using the low-resolution training data is very similar to the fully-sampled training data or even performs better (lower root mean square differences) with certain frames. Therefore, this data indicates that it is unnecessary to use multiple scans for a more precise Q. The right side of FIG. 5 shows that the choice of initial image is not critical, because both initial images give the same results after approximately 10 frames. However, even though the root mean square differences are larger with the spatially blurred initial image in the beginning, they converge faster as the values drop faster compared with the temporal-blurred initial image. Therefore, the spatially blurred initial image was chosen in the experiments.

Figure 6:
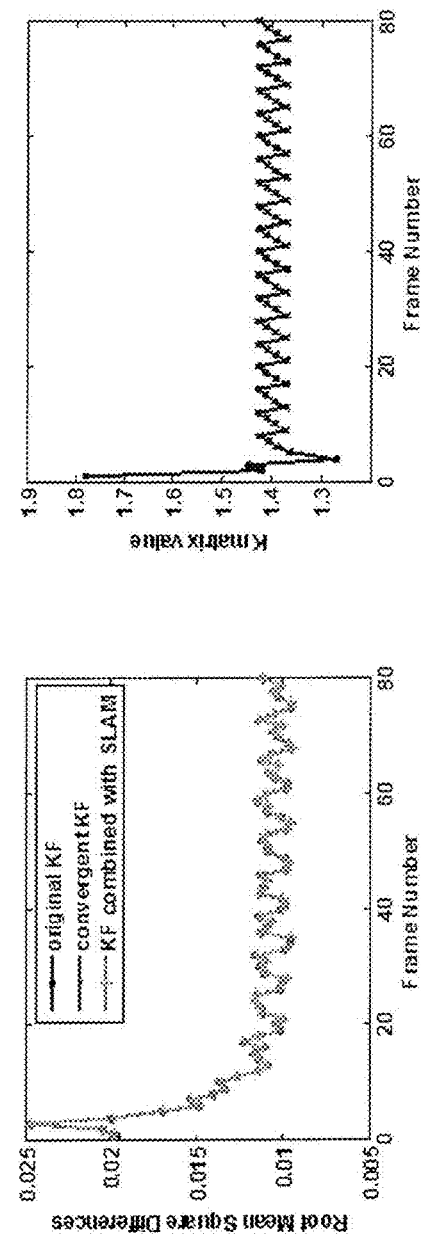
FIG. 6 illustrates, according to one example of practicing concepts and technologies as described herein with respect to Example 1, root mean square differences of the Kalman filter model using the original algorithm and simplified algorithms (left) and a simulation demonstrating that $K_k$ approaches a periodic steady state. The simplified algorithms produce similar results.

The left side of FIG. 6 shows the root mean square differences of the reconstructed image series and the baseline image series using the original Kalman filter model, the convergent Kalman filter model and the convergent Kalman filter model combined with SLAM. It indicates that the results using the original algorithm and the two simplified algorithms are almost identical, meaning the simplifications of the Kalman filter model do not harm the effectiveness of the model. The right side of FIG. 6 plots the value of $K_k$ at a fixed location with the original Kalman filter model. The result conforms to our expectation as $K_k$ approaches a periodic steady state with period 4, which is the undersampling ratio used in this simulation. Therefore, in practice, the convergent Kalman filter model combined with SLAM is used to maximally reduce the reconstruction time.

Figure 7:
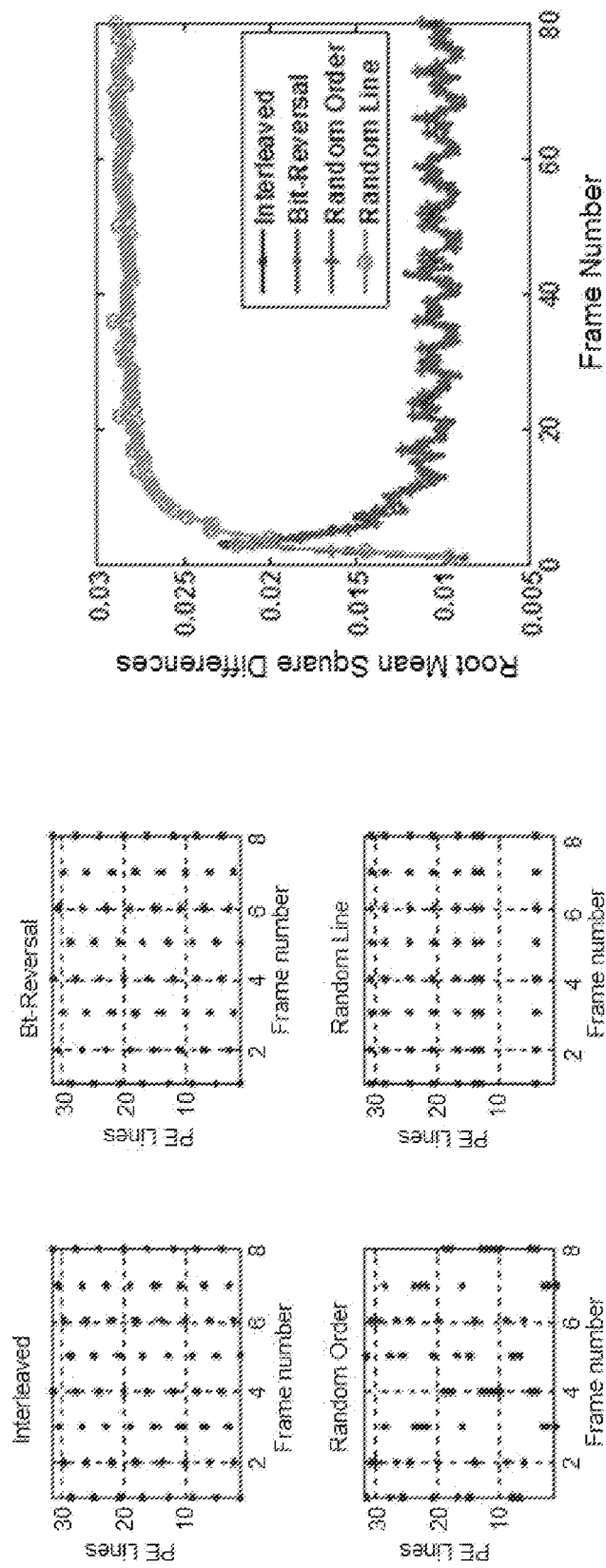
FIG. 7 illustrates root mean square differences of the Kalman filter model using different sampling patterns according to one example of practicing concepts and technologies as described herein with respect to Example 1. The three sampling patterns that cover all of k-space in several frames result in similar error levels, and they each have substantially lower error than a random sampling pattern.

FIG. 7 plots the 4 types of sampling patterns (left) and the resulting root mean square differences using these sampling patterns. There are no apparent differences among the first three types of the sampling patterns in terms of root mean square differences and they all perform better than the fourth type of the sampling pattern. This shows that a sampling pattern that covers the entire k-space in several frames is preferred. This is because the Kalman filter relies on all previous measurements to give an optimal estimate of the current state, so acquiring all of k-space provides comprehensive information to better estimate the current image, even though the k-space acquisition is completed over several frames.

Figure 8:
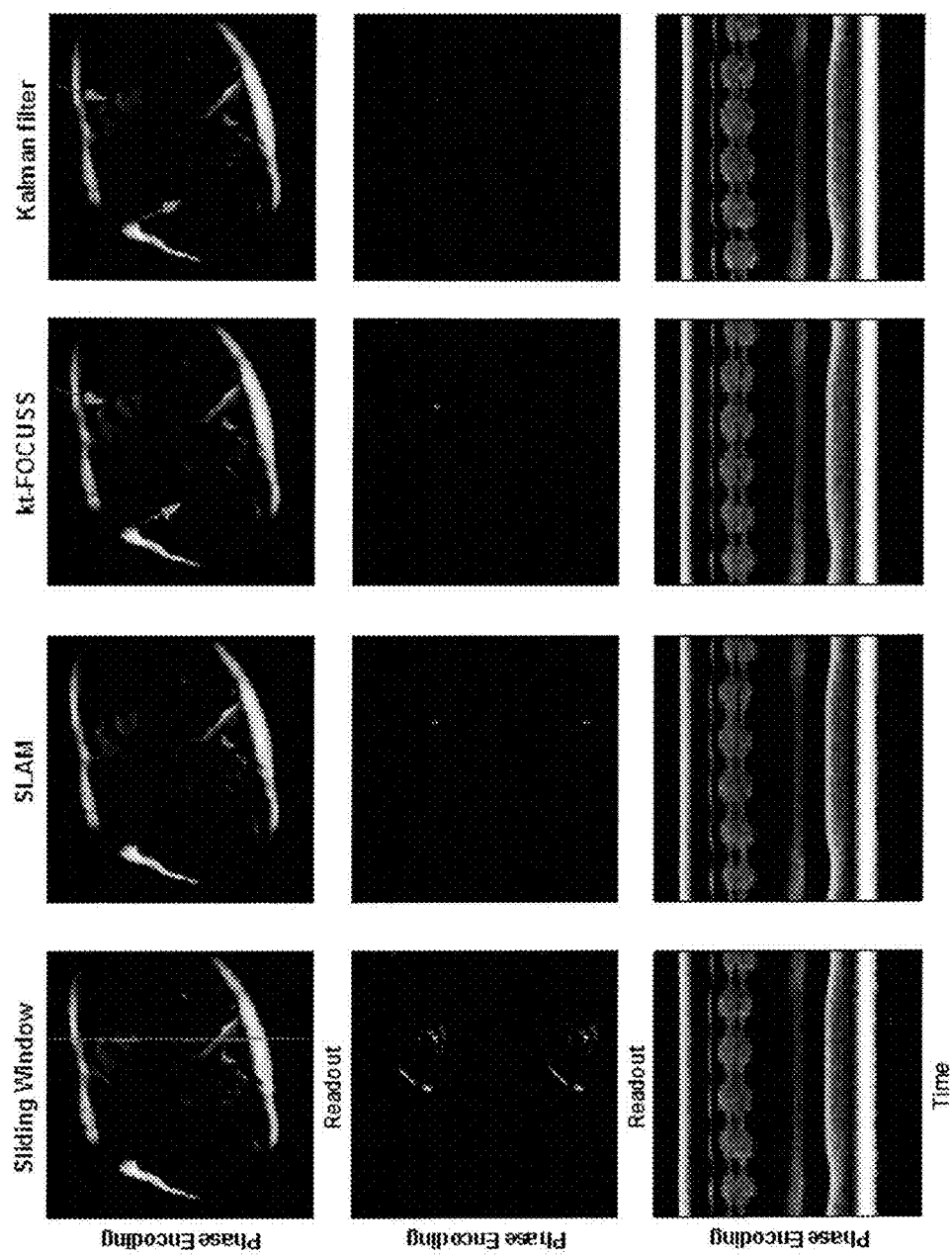
FIG. 8 illustrates, according to one example of practicing concepts and technologies as described herein with respect to Example 1, images reconstructed using sliding window, SLAM, kt-FOCUSS and Kalman filter methods with undersampling factor of 2 (top row), the corresponding difference images with the raw image (middle row) and the image intensities along the red vertical line (top left image) as a function of time (bottom row). Aliasing and temporal blurring are lowest for the Kalman filter method.
Figure 9:
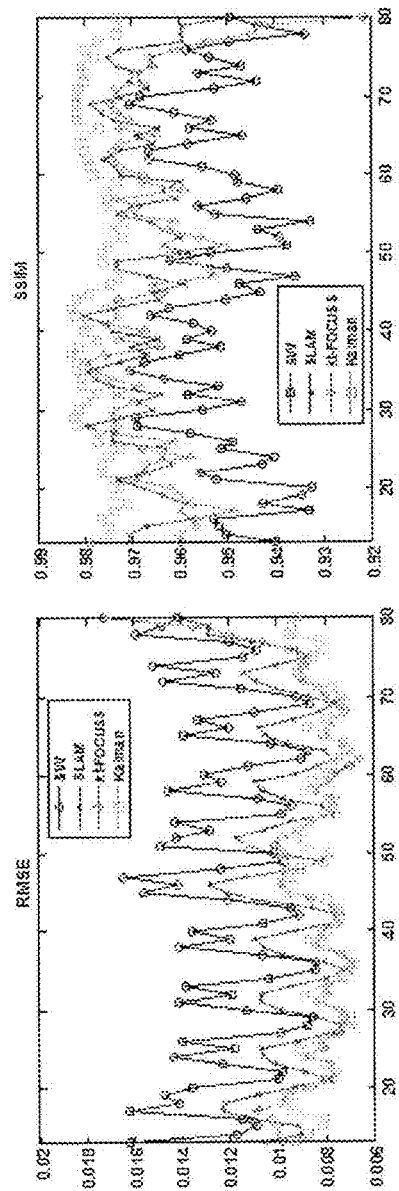
FIG. 9 illustrates RMSE (left) and SSIM (right) between the reconstructed image series and the raw image series according to one example of practicing concepts and technologies as described herein with respect to Example 1.

FIG. 8 shows example images reconstructed using the sliding window, SLAM, kt-FOCUSS and the Kalman filter with undersampling ratio of 2 (top row), the corresponding difference images with the raw image (middle row) and the image intensities of one phase encoding line as indicated in the top left image across the entire image series (bottom row) in a single-coil simulation study with a free breathing short axis image series. The ghost artifacts due to motion are obvious in the sliding window and SLAM methods and are greatly alleviated with Kalman filter method. The aliasing pattern with kt-FOCUSS is different from the other methods due to the non-linearity of the reconstruction. In addition, some blurring occurs in free-breathing situations as illustrated by the arrows in FIG. 8. The images along the bottom row show that the Kalman filter provides the highest temporal resolution as the changes of the left ventricle radius are the sharpest. FIG. 9 shows a plot of the root mean square error (RMSE) and the structural similarity index (SSIM) between the reconstructed image series and the raw image series in the same simulation study. The Kalman filter provides a lower RMSE and a higher SSIM compared with sliding window (SW) and SLAM in most of our simulation studies with undersampling ratios of 2 and 4, including the study shown in FIG. 8. As shown in FIG. 9, the decrease of RMSE and increase of SSIM are more obvious in frames when the cardiac motion is very fast, such as the end-systolic phase of the cardiac cycle. Comparing the Kalman filter with kt-FOCUSS, kt-FOCUSS yielded the lowest RMSE with most breath-held simulations; however, with free-breathing simulations, kt-FOCUSS sometimes had higher RMSE than the Kalman filter method.

Experiments

Figure 10:
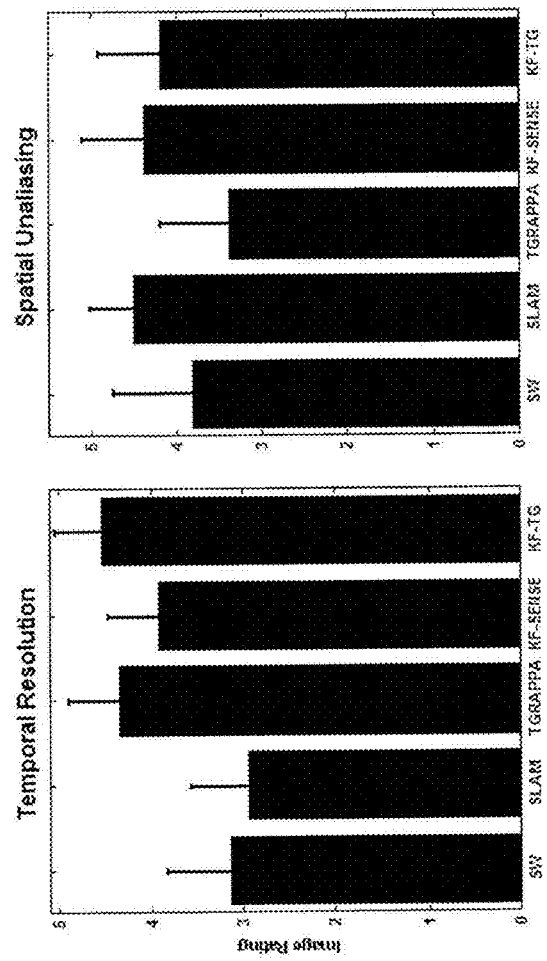
FIG. 10 illustrates temporal resolution and spatial unaliasing ratings by two blinded expert readers according to one example of practicing concepts and technologies as described herein with respect to Example 1.

FIG. 10 shows the results of the blind review for a total of 8 experiments including 4 short axis and 4 long axis experiments with acceleration factor 4. The visually assessed temporal resolution is improved with TGRAPPA, KF-SENSE and KF-TGRAPPA (KF-TG) compared with sliding window and SLAM and the improvement was statistically significant from the two-tailed Wilcoxon signed rank test ($p<0.05$ for SW vs. KF-SENSE, SW vs. KF-TG, SLAM vs. KF-SENSE, SLAM vs. KF-TG). For the degree of spatial aliasing, the ratings of KF-SENSE and KF-TGRAPPA were not statistically different from sliding window and SLAM, although KF-SENSE and SLAM were slightly better than SW and KF-TG. Comparing KF-TGRAPPA with TGRAPPA, there was significant reduction in spatial aliasing ($p<0.05$) and slightly better temporal resolution.

Discussion

A Kalman-filter-based image reconstruction method is hereby developed for real-time reconstruction of Cartesian dynamic image series and implemented in a real-time CMR study. The model is combined with SENSE and TGRAPPA. The major advantages of this method include the capability for non-iterative real-time reconstruction and significantly improved temporal resolution. The capability for non-iterative real-time reconstruction lies in the fact that as long as the model is established, the Kalman filter can generate an optimal estimate of the current state given all previous measurements with a single prediction-correction process without iteration. The reconstruction in this study was performed offline using Matlab and has not yet been implemented on the scanner's reconstruction computer. However, the computational load is relatively small and can be realized with moderate computing hardware. The offline reconstruction time for an entire image series (80 frames, 128*128) is about 4 seconds in Matlab using a laptop with a 2.2 Ghz CPU and without parallel computing. This corresponds to a computation time of 50 ms per temporal frame. Furthermore, as discussed previously, if the sampling pattern is periodic, the major computation, which is the calculation of the Kalman gain matrix $K_k$, can be performed before the data acquisition and thus the subsequent reconstruction requires only two matrix-vector multiplications and one vector-vector addition per readout pixel. In addition, the algorithm is easily parallelizable, because each readout pixel can be treated independently; thus, parallel computing can be easily implemented to reduce the reconstruction time.

The improvement in temporal resolution with this method is because the Kalman filter can capture rapid changes with limited measurements. For example, if the k-space measurements are under-sampled, the information is not enough to get an accurate current estimate from just that data; however, the relationship between the current and the past states represented by the state model can be exploited to benefit the current estimate. In this study, the pixels with lower variance rely more on past states by the prediction step; the pixels with larger variance rely more on the measurements by the correction step. Therefore, since the number of pixels with large variance is much smaller than the total number of pixels, the information contained in the k-space measurements is sufficient to provide an accurate current estimate.

Although this Example focuses on a real-time cardiac study, this model is not limited to this application. In this application, a simple assumption is made to just copy the previous state to get the current state. For other applications, the model may use modifications if information about the evolution of the states can be obtained. The framework to simplify the 2D problem to a 1D problem makes it easier to modify and implement a more complicated model such as the APMA model to more accurately describe the relationships among the states.

The combination with parallel imaging techniques can further reduce scan time and improve image quality, as demonstrated by KF-SENSE and KF-TGRAPPA. Both are suitable for real-time reconstruction, although KF-SENSE is more computationally demanding, resulting in longer image reconstruction times. The coil sensitivity estimation in KF-SENSE can be further explored to improve image quality. For KF-TGRAPPA, the error covariance of the filled k-space data in this disclosure is not necessarily an optimal choice but simply an empirical one.

Upon visual analysis, the improvement in temporal resolution is obvious with the Kalman filter; however, the cardiologists who scored the images were not bothered by some aliasing artifacts that were apparent in difference images in the simulation study, because they mainly focused on the cardiac region and the aliasing was relatively small in that region. There are some flickering artifacts with the Kalman filter model that lead to a lower rating in spatial unalising.

In conclusion, the Kalman filter method is a novel real-time reconstruction method in dynamic MRI that can improve the temporal resolution. The real-time reconstruction may be valuable compared with retrospective and/or iterative reconstruction methods. The versatility of the model is also an advantage.

APPENDIX

Derivation of $Q=Q_{raw}-2c\sigma^2 I$

The k-space data from the training scan $z_t$ is contaminated with measurement noise $n_t$ given as $z_t=s_t+n_t$ and the covariance matrix $Q_{raw}$ is estimated from the differences of two consecutive images $i_{t+1}-i_t$ in which $i_t=F^{-1}z_{t+1}$. Therefore, we have $$\begin{aligned} Q_{raw} &= \text{mean}\left[(F^{-1}z_{t+1} - F^{-1}z_t)^T(F^{-1}z_{t+1} - F^{-1}z_t)\right] \\ &= \text{mean}\left[(F^{-1}s_{t+1} - F^{-1}s_t)^T(F^{-1}s_{t+1} - F^{-1}s_t)\right] + \\ &\quad \text{mean}\left[(s_{t+1} - s_t)^T(F^{-1})^T F^{-1}(n_{t+1} - n_t)\right] + \\ &\quad \text{mean}\left[(n_{t+1} - n_t)^T(F^{-1})^T F^{-1}(s_{t+1} - s_t)\right] + \\ &\quad \text{mean}\left[(F^{-1}n_{t+1} - F^{-1}n_t)^T(F^{-1}n_{t+1} - F^{-1}n_t)\right] \end{aligned}$$

-continued $$= Q + \text{mean}\left[(n_{t+1})^t (F^{-1})^T F^{-1} n_{t+1}\right] +$$
$$\text{mean}\left[(n_t)^T (F^{-1})^T F^{-1} n_t\right]$$
$$= Q + 2c\sigma^2 I$$

in which the mean of the cross terms between $s_{t+1}-s_t$ and $n_{t+1}-n_t$ is zero due to the whiteness of the noise and c is a constant determined by the normalization factor of the Fourier transform matrix F.

The specific configurations, choice of materials and chemicals, and the size and shape of various elements can be varied according to particular design specifications or constraints requiring a system or method constructed according to the principles of the present disclosure. For example, while certain example ranges have been provided for the search windows and patch sizes, for example, other resolutions could be used depending on the application and the desired final image resolution. Such changes are intended to be embraced within the scope of the present disclosure. The presently disclosed embodiments, therefore, are considered in all respects to be illustrative and not restrictive. The scope of the present disclosure is indicated by the appended claims, rather than the foregoing description, and all changes that come within the meaning and range of equivalents thereof are intended to be embraced therein.

LIST OF REFERENCES

[1] Sodickson D K, Manning W J. Simultaneous acquisition of spatial harmonics (SMASH): fast imaging with radiofrequency coil arrays. Magn Reson Med 1997; 38(4):591-603.

[2] Pruessmann K P, Weiger M, Scheidegger M B, Boesiger P. SENSE: sensitivity encoding for fast MRI. Magn Reson Med 1999; 42(5):952-962.

[3] Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002; 47(6):1202-1210.

[4] Rehwald W G, Kim R J, Simonetti O P, Laub G, Judd R M. Theory of high-speed MR imaging of the human heart with the selective line acquisition mode. Radiology 2001; 220(2): 540-547.

[5] Madore B, Glover G H, Pelc N J. Unaliasing by fourier-encoding the overlaps using the temporal dimension (UNFOLD), applied to cardiac imaging and fMRI. Magn Reson Med 1999; 42(5):813-828.

[6] Tsao J, Boesiger P, Pruessmann K P. k-t BLAST and k-t SENSE: dynamic MRI with high frame rate exploiting spatiotemporal correlations. Magn Reson Med 2003; 50(5): 1031-1042.

[7] Jung H, Sung K, Nayak K S, Kim E Y, Ye J C. k-t FOCUSS: a general compressed sensing framework for high resolution dynamic MRI. Magn Reson Med 2009; 61(1):103-116.

[8] Hu X, Parrish T. Reduction of field of view for dynamic imaging. Magn Reson Med 1994; 31(6):691-694.

[9] Madore B, Fredrickson J O, Alley M T, Pelc N J. A reduced field-of-view method to increase temporal resolution or reduce scan time in cine MRI. Magn Reson Med 2000; 43(4):549-558.

[10] Brummer M E, Moratal-Perez D, Hong C Y, Pettigrew R I, Millet-Roig J, Dixon W T. Noquist: reduced field-of-view imaging by direct Fourier inversion. Magn Reson Med 2004; 51(2):331-342.

[11] Di Bella E V, Wu Y J, Alexander A L, Parker D L, Green D, McGann C J. Comparison of temporal filtering methods for dynamic contrast MRI myocardial perfusion studies. Magn Reson Med 2003; 49(5):895-902.

[12] Adluru G, Awate S P, Tasdizen T, Whitaker R T, Dibella E V. Temporally constrained reconstruction of dynamic cardiac perfusion MRI. Magn Reson Med 2007; 57(6):1027-1036.

[13] Sumbul U, Santos J M, Pauly J M. Improved time series reconstruction for dynamic magnetic resonance imaging. IEEE Trans Med Imaging 2009; 28(7):1093-1104.

[14] Sumbul U, Santos J M, Pauly J M. A practical acceleration algorithm for real-time imaging. IEEE Trans Med Imaging 2009; 28(12):2042-2051.

[15] Kellman P, Epstein F H, McVeigh E R. Adaptive sensitivity encoding incorporating temporal filtering (TSENSE). Magn Reson Med 2001; 45(5):846-852.

[16] Breuer F A, Kellman P, Griswold M A, Jakob P M. Dynamic autocalibrated parallel imaging using temporal GRAPPA (TGRAPPA). Magn Reson Med 2005; 53(4):981-985.

[17] Hamilton L H, Fabregat J A, Moratal D, Ramamurthy S, Lerakis S, Parks W J, Sallee D, 3rd, Brummer M E. "PINOT": time-resolved parallel magnetic resonance imaging with a reduced dynamic field of view. Magn Reson Med 2011; 65(4):1062-1074.

[18] Kyriakos W E, Panych L P, Kacher D F, Westin C F, Bao S M, Mulkern R V, Jolesz F A. Sensitivity profiles from an array of coils for encoding and reconstruction in parallel (SPACE RIP). Magn Reson Med 2000; 44(2):301-308.

[19] Analytic Sciences Corporation. Technical Staff., Gelb A. Applied optimal estimation. Cambridge, Mass.,: M.I.T. Press; 1974. 374 p. p.

[20] Buehrer M, Pruessmann K P, Boesiger P, Kozerke S. Array compression for MRI with large coil arrays. Magn Reson Med 2007; 57(6):1131-1139.

The invention claimed is:

1. A method, comprising:

acquiring magnetic resonance data for an area of interest of a subject that is associated with at least one physiological activity of the subject, wherein acquiring the magnetic resonance data comprises Cartesian sampling, and wherein the Cartesian sampling comprises Cartesian k-space measurement wherein undersampling is performed in a phase encoding direction and k-space is fully sampled or oversampled in a readout direction; and performing image reconstruction comprising Kalman filtering or smoothing on Cartesian images of a Cartesian dynamic image series associated with the acquired magnetic resonance data, wherein the image reconstruction comprises increasing at least one of spatial or temporal resolution of the Cartesian images, and wherein a direct one-dimensional Fourier transform is performed along the readout direction and a Kalman filter is applied for the image reconstruction along the phase encoding direction.

2. The method of claim 1, wherein performing the image reconstruction comprises performing non-iterative image reconstruction.

3. The method of claim 1, wherein performing the image reconstruction comprises linear filtering in real-time.

4. The method of claim 1, wherein performing the image reconstruction comprises estimating a current state of the area of interest based on image data corresponding to a past state of the area of interest, based on at least one of temporal or spatial redundancies.

5. The method of claim 1, further comprising generating, based on the Cartesian image reconstruction, at least one visual representation, for presentation on a display, of the physiological activity in the area of interest of the subject.

6. The method of claim 1, wherein the at least one physiological activity comprises cardiac activity.

7. A system, comprising:
a magnetic resonance imaging (MRI) device;
one or more processors; and
at least one memory device in communication with the MRI device, storing computer-readable instructions that, when executed by the one or more processors, cause the system to:
acquire magnetic resonance data for an area of interest of a subject that is associated with at least one physiological activity of the subject, wherein acquiring the magnetic resonance data comprises Cartesian sampling, and wherein the Cartesian sampling comprises Cartesian k-space measurement wherein undersampling is performed in a phase encoding direction and k-space is fully sampled or oversampled in a readout direction; and
perform image reconstruction comprising Kalman filtering or smoothing on Cartesian images of a Cartesian dynamic image series associated with the acquired magnetic resonance data,
wherein the image reconstruction comprises increasing at least one of spatial or temporal resolution of the Cartesian images, and
wherein a direct one-dimensional Fourier transform is performed along the readout direction and a Kalman filter is applied for the image reconstruction along the phase encoding direction.

8. The system of claim 7, wherein performing the image reconstruction comprises performing non-iterative image reconstruction.

9. The system of claim 7, wherein performing the image reconstruction comprises linear filtering in real-time.

10. The system of claim 7, wherein performing the image reconstruction comprises estimating a current state of the area of interest based on image data corresponding to a past state of the area of interest, based on at least one of temporal or spatial redundancies.

11. The system of claim 7, further comprising generating, based on the Cartesian image reconstruction, at least one visual representation, for presentation on a display, of the physiological activity in the area of interest of the subject.

12. The system of claim 7, wherein the at least one physiological activity comprises cardiac activity.

13. A non-transitory computer-readable storage medium having stored computer-executable instructions that, when executed by one or more processors, cause a computer to perform functions comprising:
acquiring magnetic resonance data for an area of interest of a subject that is associated with at least one physiological activity of the subject, wherein acquiring the magnetic resonance data comprises Cartesian sampling, wherein the Cartesian sampling comprises Cartesian k-space measurement wherein undersampling is performed in a phase encoding direction and k-space is fully sampled or oversampled in a readout direction; and
performing image reconstruction comprising Kalman filtering or smoothing on Cartesian images of a Cartesian dynamic image series associated with the acquired magnetic resonance data,
wherein the image reconstruction comprises increasing at least one of spatial or temporal resolution of the Cartesian images, and
wherein a direct one-dimensional Fourier transform is performed along the readout direction and a Kalman filter is applied for the image reconstruction along the phase encoding direction.

14. The non-transitory computer-readable storage medium of claim 13, wherein performing the image reconstruction comprises performing non-iterative image reconstruction.

15. The non-transitory computer-readable storage medium of claim 13, wherein performing the image reconstruction comprises linear filtering in real-time.

16. The non-transitory computer-readable storage medium of claim 13, wherein performing the image reconstruction comprises estimating a current state of the area of interest based on image data corresponding to a past state of the area of interest, based on at least one of temporal or spatial redundancies.

17. The non-transitory computer-readable storage medium of claim 13, further comprising generating, based on the Cartesian image reconstruction, at least one visual representation, for presentation on a display, of the physiological activity in the area of interest of the subject.

18. The non-transitory computer-readable storage medium of claim 13, wherein the at least one physiological activity comprises cardiac activity.

* * * * *